United States Patent [19]
van Roermund

[11] Patent Number: 4,518,935
[45] Date of Patent: May 21, 1985

[54] BAND-REJECTION FILTER OF THE SWITCHED CAPACITOR TYPE

[75] Inventor: Arthur H. M. van Roermund, Eindhoven, Netherlands

[73] Assignee: U.S. Philips Corporation, New York, N.Y.

[21] Appl. No.: 535,497

[22] Filed: Sep. 26, 1983

[30] Foreign Application Priority Data

Jul. 12, 1983 [NL] Netherlands .................. 8302482

[51] Int. Cl.³ .................................... H03H 19/00
[52] U.S. Cl. .................................... 333/173; 307/521; 328/151; 333/174
[58] Field of Search ................. 333/173, 172, 174, 175, 333/167; 328/151, 167, 127; 330/109; 307/352, 353, 520–524; 364/724

[56] References Cited
U.S. PATENT DOCUMENTS 3,774,125 11/1973 Condon et al. ................... 333/173
4,179,665 12/1979 Gregorian ........................ 333/173 X
4,315,227 2/1982 Fleischer et al. ................ 333/174 X

Primary Examiner—Marvin L. Nussbaum
Attorney, Agent, or Firm—Thomas A. Briody; William J. Streeter

[57] ABSTRACT

Band-rejection filter of the switched capacitor type in which at least one unwanted frequency component present in an information signal must be suppressed. To that end this filter comprises and adding circuit 4 to which the information signal is applied via a switching device 3 and a feedback signal via a switching device 5. Both switching devices are controlled by a first control signal consisting of a sequence of control signal periods of a duration $T_s$ which are each divided into a tracking phase and into an interrupt phase. During the tracking phase the signal can pass uninterruptedly through the switching device, while during the interrupt phase signals are not allowed to pass. The output of adding circuit 4 is coupled inter alia via a switching device 8 to the input of a bandpass filter 9 whose passband at least coincides with the unwanted frequency component. The switching device 8 is controlled by a second control signal which is also formed by a sequence of control signal periods of a duration $T_s$ and which are each divided into a tracking and an interrupt phase.

In order to realize an adequate suppression of the unwanted frequency component the instants at which the tracking phases in the first control signal and the tracking phases in the second control signal end are mutually phase-shifted over a fixed distance.

1 Claim, 23 Drawing Figures

BAND-REJECTION FILTER OF THE SWITCHED CAPACITOR TYPE

BACKGROUND OF THE INVENTION (1). Field of the Invention

The invention relates to a band-rejection filter (notch filter) for suppressing at least one unwanted frequency component, (called noise component hereinafter) present in an analogue information signal. For that purpose it comprises a forward path and a negative feedback path coupled thereto for selective negative feedback of the said noise component. This negative feedback path comprises a bandpass filter whose output signal is subtracted from the information signal in the forward path and which has a very high gain factor for the noise component to be suppressed.

Such a band-rejection filter can, for example, be used as a servo-control loop for controlling the position of a setting element in an optical reading arrangement for disc-shaped information carriers, for example as described in Reference 1. It can alternatively be used in a decoding circuit for stereo multiplex signals, as proposed in, for example, reference 2.

(2). Description of the Prior Art

In order to provide adequate suppression of the noise component, the band-rejection filter must be adjusted accurately, which is time-consuming and expensive. To obviate this, the band-rejection filter can be implemented with the aid of digital filters and a digital difference producer might alternatively be employed for subtracting the digital output signal of the digital bandpass filter from the information signal. However, such an implementation of the band-rejection filter requires the use of a digital-to-analogue converter. As is known, such converters introduce however a significant amount of quantization noise, while the band-rejection filter realized thus with the aid of digital circuits dissipates, in addition, a considerable power. A band-rejection filter implemented in this way has however the advantage that it can completely be constructed as an IC (Integrated Circuit), but it requires a large substrate surface area.

A band-rejection filter which has indeed the advantages, but not the disadvantages of the above-described filter formed from digital circuits is proposed in Reference 2. More specifically, it is proposed therein to form the band-rejection filter with the aid of the switched capacitors. The input of this bandpass filter is then coupled to the filter output via a switching arrangement. The signal stream to this bandpass filter is periodically interrupted by this switching arrangement. Also the negative feedback signal and the analogue information signal are each applied to an adding device via a switching arrangement.

The said switching arrangements are all controlled by a control signal consisting of a sequence of control signal periods having a duration $T_s$ and occurring at a rate $f_s$ and produced by a control signal generator. Each control signal period is divided into a tracking phase and an interrupt phase. More specifically, such a switching arrangement allows the signal applied to it to pass unobstructedly during each tracking phase, whereas during each interrupt phase the switching arrangement does not allow signals to pass.

Should the sum signal produced by the adding device be prevented from being lost when the switching devices do not allow signals to pass, then a hold circuit can be provided at the output of the adding device.

Only analogue signals are now processed in this band-rejection filter of the switched capacitor type. This means that neither an analogue-to-digital converter nor a digital-to-analogue converter is required therein and that consequently no quantization noise is introduced. Partly as a result thereof the consumed power and the required substrate surface area on integration can be small. In practice it has been found that with this band-rejection filter a noise frequency suppression of approximately 30 dB can be achieved, which is sufficient for many uses.

OBJECT AND SUMMARY OF THE INVENTION

The invention has for its object to realise in the above-mentioned band-rejection filter of the switched capacitor type a further suppression of the noise frequency in order to thus extend the range of applications.

According to the invention, for that purpose both the switching device through which the analogue information signal is applied to the adding device, and also the switching device via the negative feedback signal is applied to the adding device are controlled by a first control signal and the switching device via which the input of the bandpass filter is coupled to the filter output is controlled by a second control signal; both control signals are produced by the control signal generator, the control signal periods $T_s$ of both control signals being the same and there being between the instants at which in the first control signals the tracking periods end and the instants at which in the second control signal these tracking periods end a fixed mutual phase shift which is unequal to zero and less than half a control signal period.

By using the measure according to the invention the noise frequency is further suppressed to approximately 45 dB.

REFERENCES

1. Regelsysteem; Netherlands Patent Application 79 01721 which has been laid open to public inspection.
2. Klokgestuurde filterinrichting; Netherlands Patent Application 8204687 (PHN 10.505)
3. A switched capacitor N-path filter; D. J. Allstot, K. S. Tan; 1980 IEEE International Symposium on Circuits and Systems Proceedings; Houston, Tex., Apr. 28-30, 1980, pages 313-316.

SHORT DESCRIPTION OF THE FIGURES

FIGS. 2A to 4H, inclusive show some time diagrams to explain the band-rejection filter shown in FIG. 1.

Figure 1:
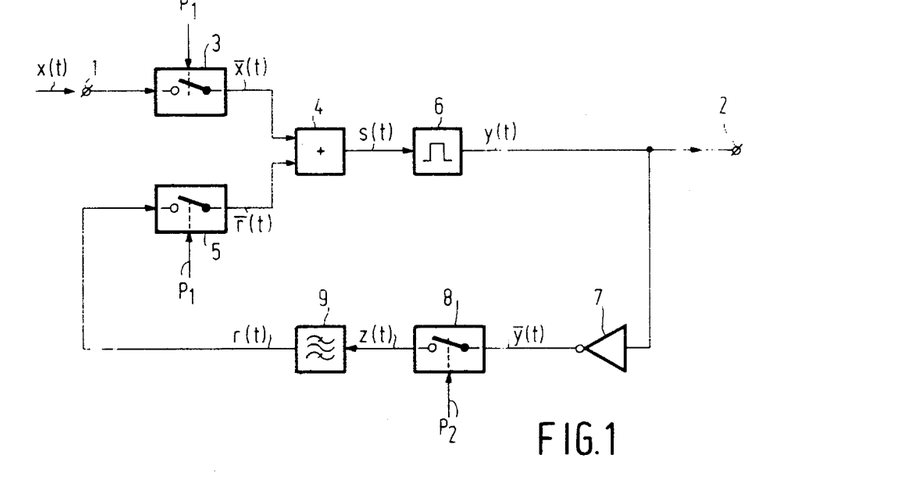
FIG. 1 shows schematically the construction of the band-rejection filter according to the invention.
Figure 2A:
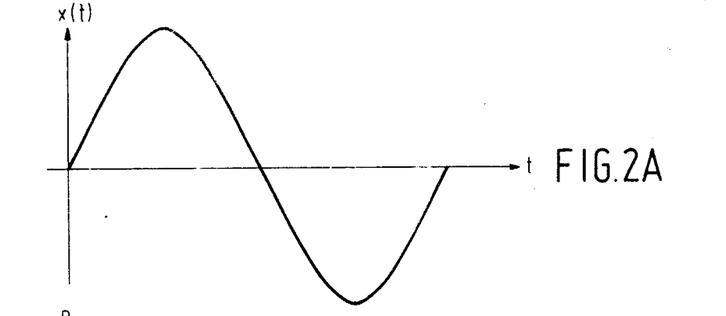

DESCRIPTION OF THE EMBODIMENTS (1). General structure of the band-rejection filter FIG. 1 shows schematically the general structure of the band-rejection filter according to the invention. It has a filter input 1 and a filter output 2. An information signal x(t) is applied to the filter input 1. Let it be assumed that this signal only consists of the noise component to be suppressed which has the frequency $f_o$. One period of this information signal x(t) is shown in FIG. 2A. Via a switching device 3 this information signal is applied to an adder circuit 4, which also receives an auxiliary feedback signal $\bar{r}(t)$ produced by a switching device 5 in response to a feedback signal r(t) applied thereto.

Figure 2B:
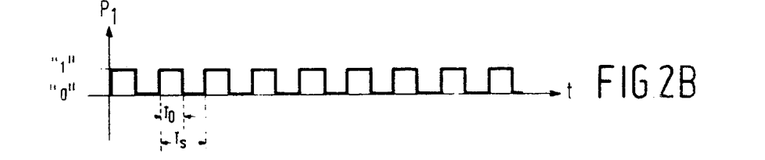
Figure 2C:
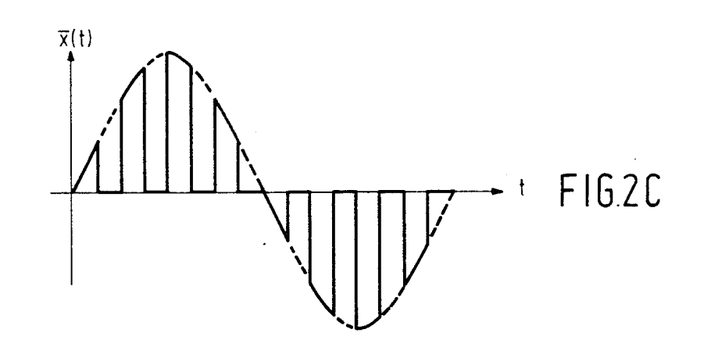

The said switching devices 3 and 5 are both controlled by a first control signal $P_1$ whose shape is shown in FIG. 2B. It consists of a sequence of first control signal periods having a duration $T_s$ which occur at a frequency $f_s=1/T_s$. Each control signal period is divided into a tracking phase and an interrupt phase. During the tracking phase the control signal assumes a first value, for example a logic "1", and the signals x(t) and r(t) are allowed to pass the respective switching devices unobstructedly. During the interrupt phase the control signal assumes a second value, for example a logic "0" and the signal path is interrupted. For the first control signal shown in FIG. 2b it is assumed that the tracking phase is of the same duration as the interrupt phase, namely $T_o=T_s/2$. The auxiliary information signal $\bar{x}(t)$ shown in FIG. 2C is now, for example, produced at the output of switching device 3. In a similar way an auxiliary feedback signal $\bar{r}(t)$ is produced at the output of switching device 5 in response to the signal r(t).

The adding circuit 4 produces a sum signal s(t) which in practice is usually applied to a filter circuit 6. Hereinafter it will be assumed that this filter circuit is in the form of a hold circuit. It produces a modified information signal y(t). During the tracking phase of the first control signal y(t) is equal to the sum signal s(t). During the interrupt phase s(t) is indeed equal to zero, but y(t) is equal to the value s(t) had at the end of the preceding tracking phase. In response to the information signal x(t) shown in FIG. 2A, the hold circuit 6 produces the modified information signal y(t) which, it being assumed that $\bar{r}(t)=0$, has the shape shown in FIG. 2D.

In the embodiment shown of the band-rejection filter this modified information signal y(t) is at the same time the output signal of the filter. To suppress unwanted noise components this signal is applied via a polarity inverter circuit 7 and a switching device 8 to a bandpass filter 9 which produces the feedback signal r(t).

Figure 2D:
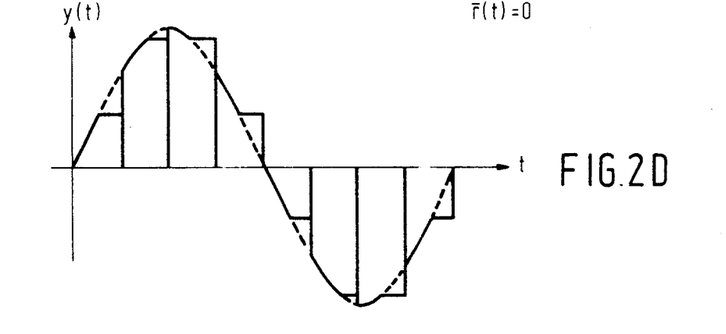
Figure 3A:
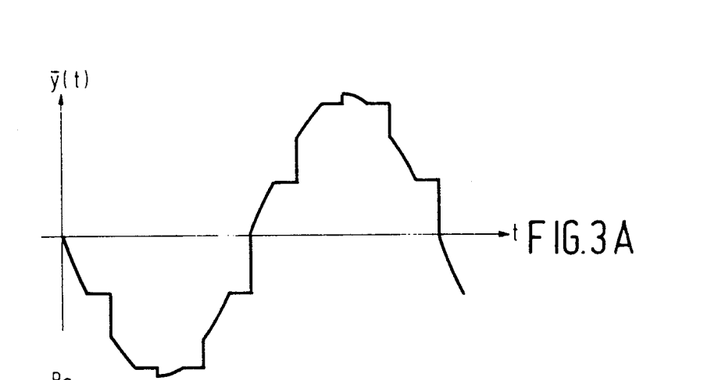
Figure 3B:
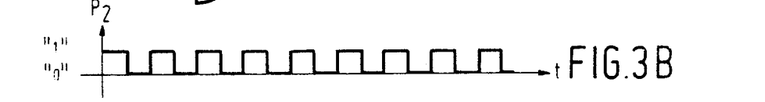

Thus, switching 8 receives the signal $\bar{y}(t)$ shown in FIG. 3A, which represents the polarity-inverted version of the modified information signal shown in FIG. 2D. This switching device 8 is controlled by a second control signal $P_2$ which has the shape shown in FIG. 3B. As is also the first control signal, this second control signal is formed by a sequence of second control signal periods having a duration $T_s$. Each second signal period is also divided into a tracking phase and an interrupt phase. Also this second control signal assumes a first value (logic "1") during the tracking phase. During this tracking phase the signal $\bar{y}(t)$ is allowed to pass unobstructedly. During the interrupt phase this second control signal assumes a second value (logic "0") and the signal path is interrupted.

Figure 3C:
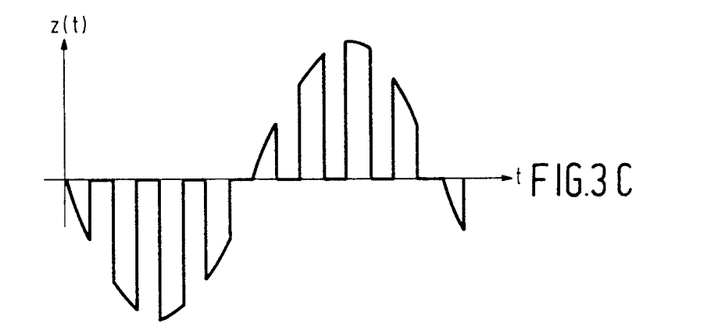

If, as is customary, tracking and interrupt phases of the second control signal coincide with the tracking and interrupt phases, respectively of the first control signal, then the switching device 8 produces the signal z(t) shown in FIG. 3C which is a polarity-inverted version of the auxiliary information signal $\bar{x}(t)$ shown in FIG. 2C.

Figure 3D:
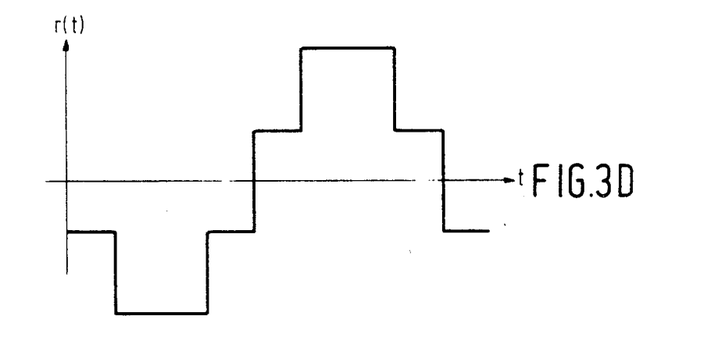
Figure 3E:
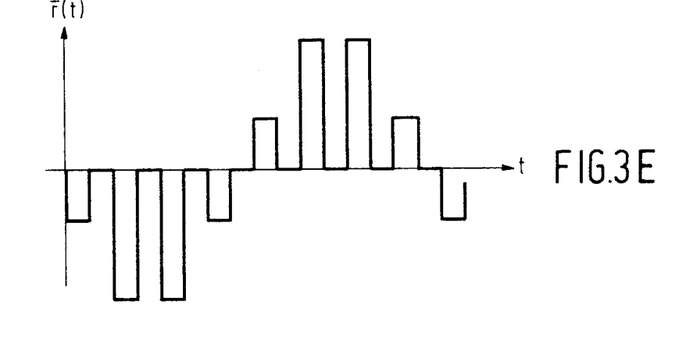
Figure 3F:
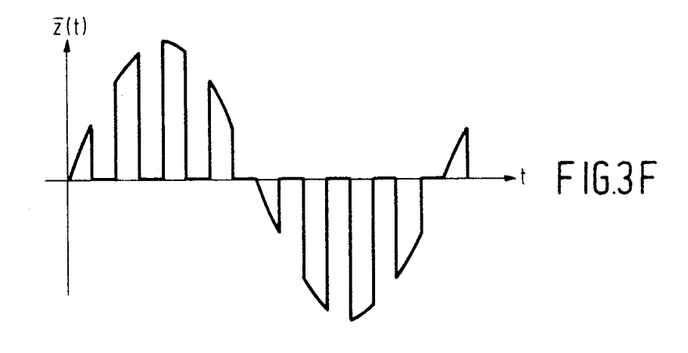
Figure 3G:
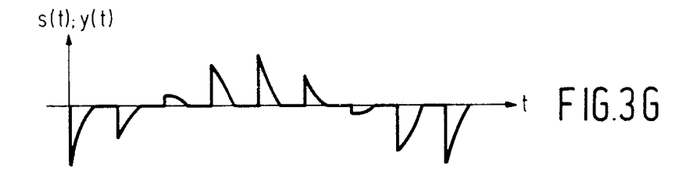

The signal z(t) thus obtained is applied to the bandpass filter 9 which is in the form of a switched capacitor N-path filter. Herein N is equal to the ratio $f_s/f_o$. Such filters are known in themselves; for example from the article indicated in reference 3. In response to the signal z(t) shown in FIG. 3C this filter produces, for example, the feedback signal r(t) whose shape is roughly shown in FIG. 3D. In response to this feedback signal the switching device 5 produces the signal shown in FIG. 3E. As the switching device 3 produces the auxiliary information signal $\bar{x}(t)$ shown once again in FIG. 3F, the sum signal s(t) shown in FIG. 3G is obtained at the output of the adding device 4. Since this sum signal is equal to zero at the end of each tracking phase of the first control signal, the modified information signal y(t) has the same shape as this sum signal. As, however, during the tracking phase of the first control signal the sum signal s(t) and consequently also the modified information signal y(t) differ significantly from zero, an attenuated version of the noise component having frequency $f_o$ remains in the modified information signal y(t).

Figure 4A:
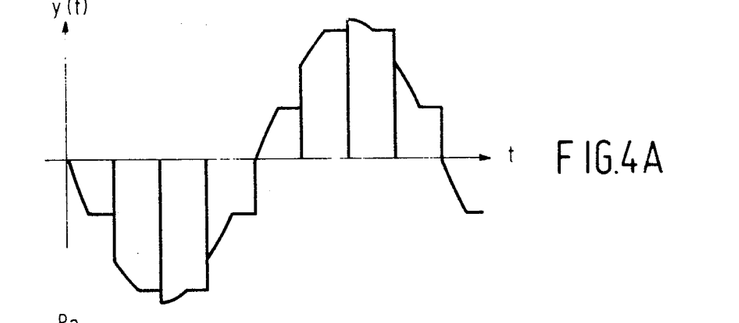
Figure 4B:
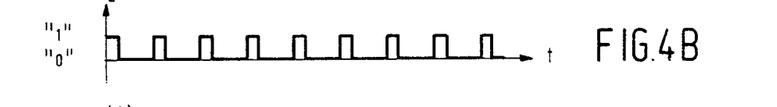
Figure 4C:
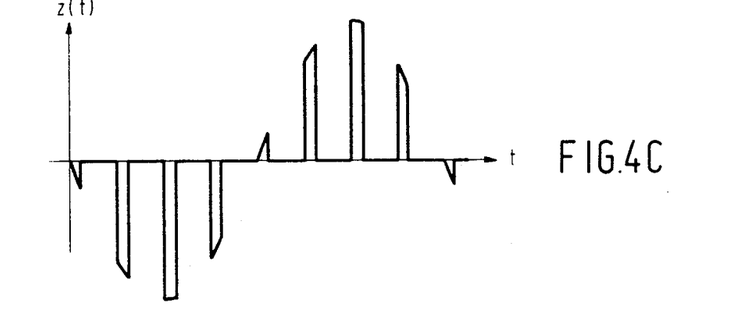
Figure 4D:
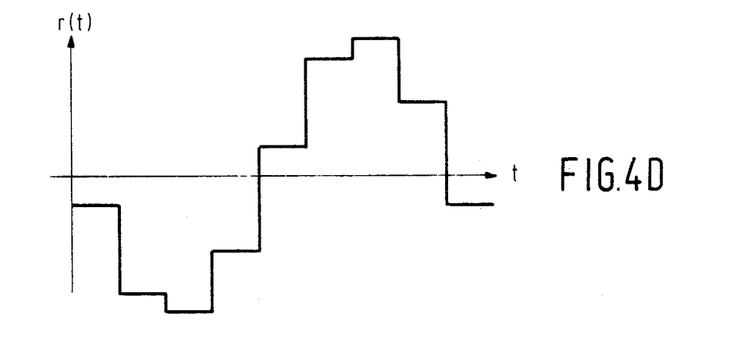
Figure 4E:
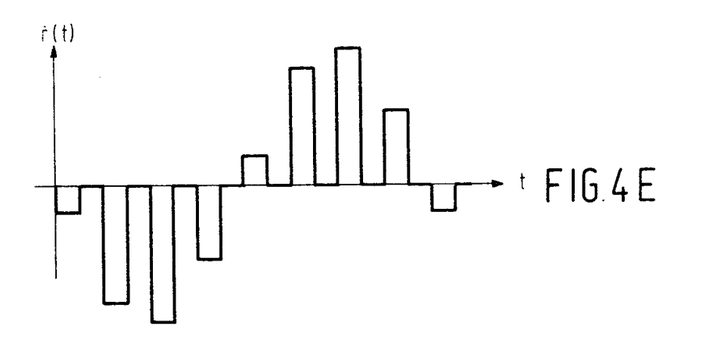
Figure 4F:
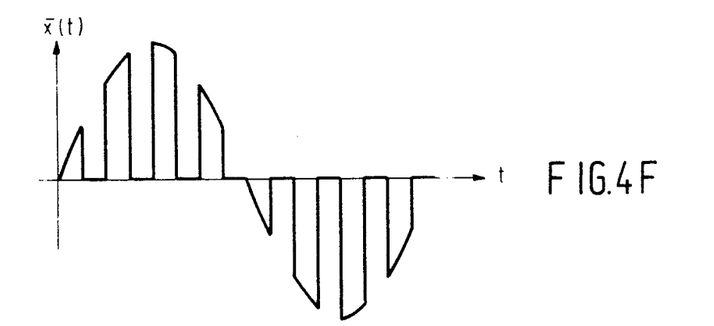
Figure 4G:
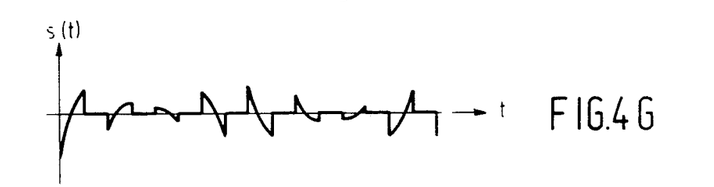
Figure 4H:
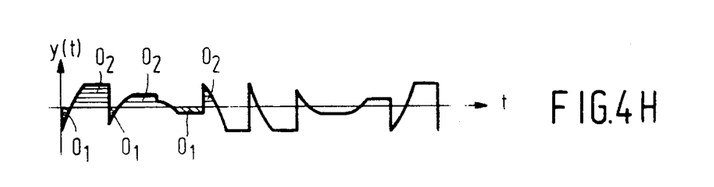

From investigations in band-rejection filters of the type described above, it has been found that a considerable further attenuation of the amplitude of the noise component can be achieved by not having the instants at which the tracking phases in the second control signal end coincide with the instants at which the tracking phases in the first control signal end, but to provide a fixed phase shift between these two instants, which shift is unequal to zero and less than half a control signal period. In order to explain further the effect of this measure FIG. 4A again shows the polarity-inverted modified information signal $\bar{y}(t)$ obtained if $\bar{r}(t)=0$. FIG. 4B shows the second control signal $P_2$. This control signal has been chosen such that the starting instants of the tracking phases coincide with those of the first control signal. The duration of the tracking phases is chosen equal to $T_s/4$. In response to the modified information signal $\bar{y}(t)$ shown in FIG. 4A the switching device 8 produces the signal z(t) shown in FIG. 4C. As a result thereof the bandpass filter 9 produces the feedback signal r(t), which is roughly shown in FIG. 4D and is converted by the switching device 5 into the auxiliary feedbacking signal $\bar{r}(t)$ shown in FIG. 4E. As the adding device 4 receives in addition to this auxiliary feedback signal also the auxiliary information signal $\bar{x}(t)$ which is shown again in FIG. 4F for the sake of completeness, it produces the sum signal s(t) shown in FIG. 4G. In response thereto the hold circuit 6 poduces the modified information signal y(t) shown in FIG. 4H. The shape of the sum signal s(t) and of the modified information signal y(t) differs completely from the signal shown in FIG. 3G and consequently has a completely different frequency spectrum. The instants at which the tracking phases in the second control signal end can now be chosen such that the noise frequency $f_o$ is fully or substantially fully suppressed. It has been found that this situation, when the hold circuit 6 is used, is obtained when these instants are chosen such that the surface area in FIG. 4H denoted by $O_1$ is approximately equal to the adjacent surface area denoted by $O_2$. From this it follows that the said phase shift must be approximately equal to $T_o/4=T_s/8$. If no hold circuit is used then it was found that this phase shift must be approximately equal to $T_s/4=T_o/2$.

(2). A practical implementation of the band-rejection filter

Figure 5:
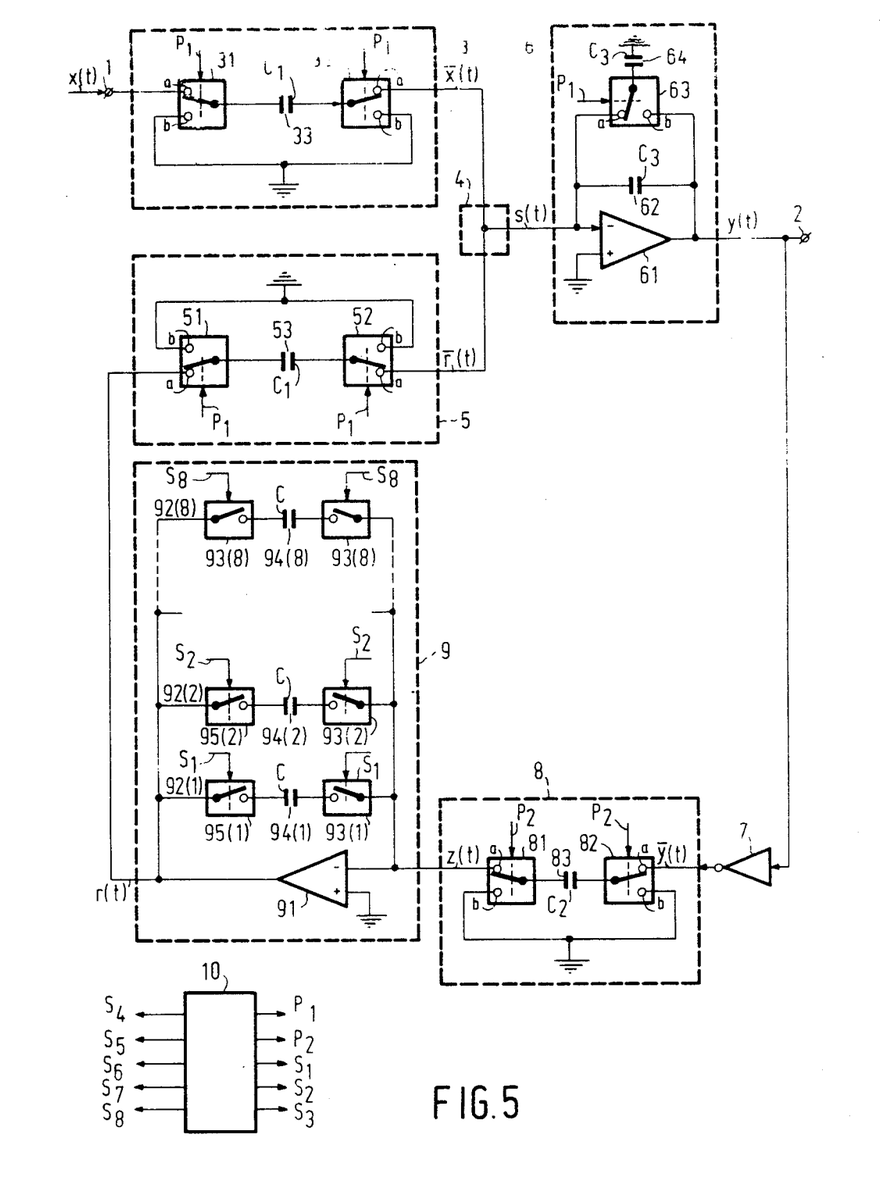
FIG. 5 shows a practical implementation of the band-rejection filter shown in FIG. 1.

FIG. 5 shows a practical implementation of the band-rejection filter. As can be seen from this Figure, switching device 3 is formed by two switches 31 and 32, each having a switching position a and b and each being controlled by the first control signal $P_1$. More specifically, these switches are in the switching position a during each tracking phase, whereas they are in the switching position b during each interrupt phase. The output of switch 31 is connected to the input of the switch 32 via a capacitor 33. This capacitor 33 has a capacitance $C_1$ and functions as a voltage-charge-converter, which converts the analogue information signal $x(t)$ into a charge $\bar{x}(t)$ during each tracking phase of the first control signal $P_1$. In each interrupt phase this capacitor is connected to ground potential and discharged.

Switching device 5 is of a similar structure as switching device 3 and is controlled in the same way by the first control signal $P_1$. More specifically, this switching device 5 comprises the switches 51 and 52 and the capacitor 53 which also has a capacitance $C_1$.

Switching device 8 is of a similar structure as the switching devices 3 and 5 and comprises the switches 81 and 82 and the capacitor 83 which has a capacitance $C_2$. Switch 82 and preferably also switch 81 are controlled by the second control signal $P_2$. Also here both switches are in the switching position a during each tracking phase and in the switching position b during each interrupt phase.

The charge $\bar{x}(t)$ produced by switching device 3 and the charge $\bar{r}(t)$ produced by switching device 5 are applied to a junction point which thus effects the adding function synbolized by the adding device 4. The sum charge $s(t)$ thus obtained is applied to the hold circuit 6 which is formed by an operational amplifier 61, which is shunted by a capacitor 62 having capacitance $C_3$. During each follow phase of $P_1$ this operational amplifier 61 produces an output voltage $y(t)$ which, as is known, is equal to $-C_1/C_3\{x(t)+r(t)\}$. Since $s(t)$ is equal to zero during each interrupt phase, the output voltage $y(t)$ remains constant during this interrupt phase and equal to the value it had at the end of the preceding tracking phase. In order to prevent this hold circuit from effecting an integration function in addition to the hold function, capacitor 62 is shunted by a switch 62 which is also controlled by the control signal $P_1$ and one pole of which is connected to ground potential via a capacitor 64 having a capacitance $C_3$. During the interrupt phase switch 63 is in the switching position b and capacitor 64 is charged to the same voltage as the voltage to which capacitor 62 is charged. During the subsequent tracking phase switch 63 is adjusted to the switching position a, causing capacitor 64 to apply its charge to capacitor 62, which is discharged thereby.

Figure 6:
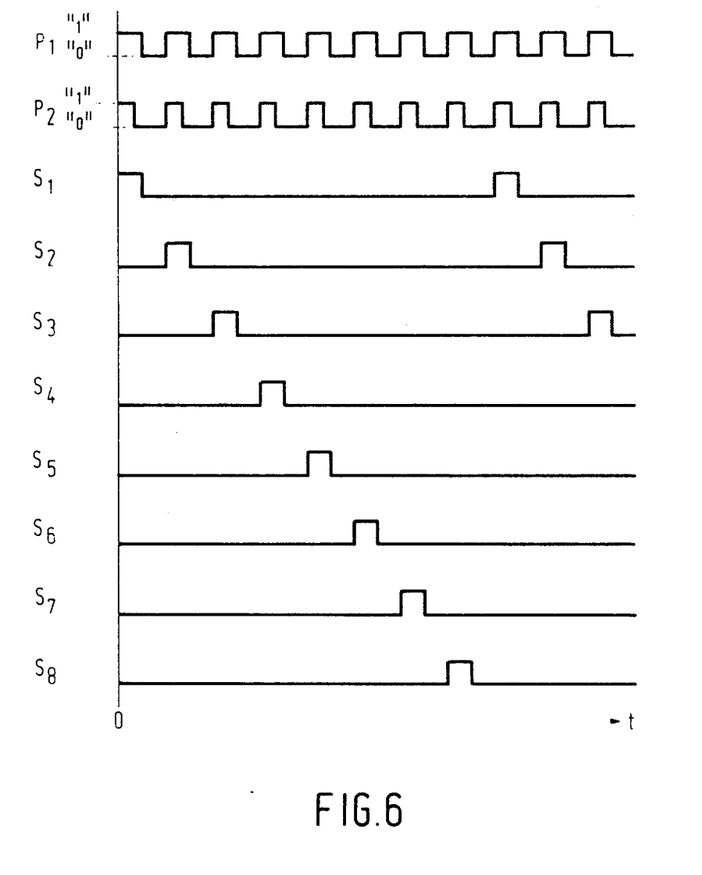
FIG. 6 shows some signals required for controlling the band-rejection filter shown in FIG. 5.

The charge $z(t)$ supplied by the switching device 8 is applied to the bandpass filter 9 which, as mentioned already in the foregoing, is of the N-path type. To that end it comprises an operational amplifier 91 which is shunted by N paths. In the embodiment shown N is chosen equal to eight. In the Figures, these paths are denoted by the reference numerals 92 (1), 92 (2) ... 92 (8). Such a path 92 (i) comprises a cascade arrangement of a first switch 93 (i), a capacitor 94 (i) having capacitance C and a second switch 95 (i). These switches are controlled by a switching signal $S_i$. These switching signals are shown in FIG. 6 together with the control signals $P_1$ and $P_2$. Since the operation of this N-path filter extensively described in Reference 3 it will not be further described here.

Figure 7:
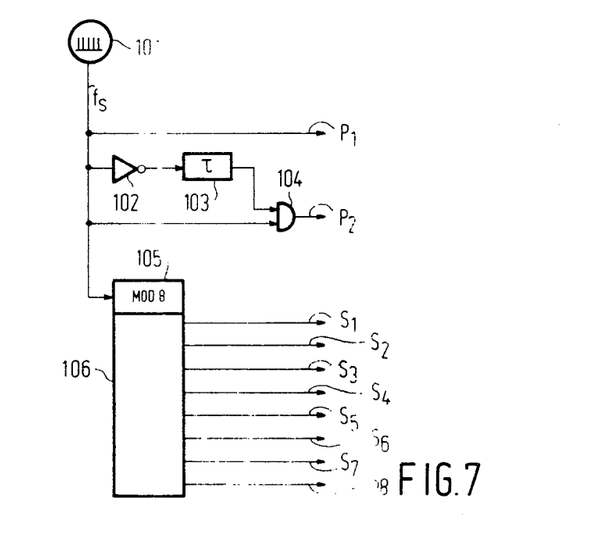
FIG. 7 shows an embodiment of a control signal generator for generating the signals shown in FIG. 6.

The control signals required for controlling this band-rejection filter is generated by a control signal generator 10, which is shown in greater detail in FIG. 7. This control signal generator comprises a clock pulse generator 101 which produces clock pulses at the rate $f_2$. So its output signal corresponds to the first control signal $P_1$. To generate the second control signal $P_2$ this first control signal $P_1$ is applied to inputs of an AND-gate 104 via an inverter 102 and a delay device and also directly. The delay device 103 has a time delay $\tau$ which is such that the desired fixed phase shift is obtained between the instant at which the tracking phase in $P_2$ ends and the instant at which the corresponding tracking phase in $P_1$ ends. In order to realize the previously mentioned fixed phase shift of $T_s/i$, $\tau$ must be equal to $3T_s/8$. Finally, the output pulses of clock pulse generator 101 are also applied to a modulo-8 counter 105, to which a decoding network 106 is connected which produces the switching signals $S_i$. More specifically it holds that when the counting position of counter 105 is equal to zero that then $S_1$ has the logic value "1" and that all the remaining switching signals have the logic value 0". If the counting position of counter 105 is equal to one, then $S_2$ has the logic value "1" and the remaining switching signals have also the logic value "0", etc.

(3) General remarks

1. In the embodiment of FIG. 5 the switching device 8 may alternatively be of such a construction that capacitor 83 is first charged up to a voltage $y(t)$ during the tracking phase and that it thereafter applies during the interrupt phase its charge to one of the capacitors 94(.), as a result of which only during the interrupt phase a charge $z(t)$ differing from zero is applied to the operational amplifier 91. In other words, the switching positions a and b of switch 81 can be interchanged, inverter 7 then being superfluous.

2. Switch 81 may alternatively be controlled such by a control signal $P_2'$ that the charge across capacitor 83 at the end of the control pulse $P_2$ is conveyed to operational amplifier 91 before the next control pulse $P_2$ occurs.

3. For the sake of simplicity it is assumed that in the control signal $P_1$ the tracking phases and the interrupt phases are of the same duration, but it is allowed to use tracking phases and interrupt phases of different durations. A corresponding modification is allowed for the second control signal $P_2$.

What is claimed is:

1. A band-rejection filter of the switched capacitor type for suppressing at least one unwanted frequency component present in an analogue information signal, comprising:
   (a) a filter input for receiving the analogue information signal and a filter output;
   (b) combining means whose output is coupled to the filter output;
   (c) first switching means for applying the information signal and a feedback signal to the combining means and which are controlled by a first control signal;
   (d) a bandpass filter of the switched capacitor type the passband of which comprises at least the unwanted frequency component and which produces the said feedback signal;

(e) second switching means for coupling the input of the bandpass filter to the filter output and which are controlled by a second control signal;

(f) a control signal generator for producing the first and second control signals, each consisting of a sequence of control signal periods of a duration $T_s$ and occurring at a frequency $f_s$ ($T_s = 1/f_s$), each control signal period being partitioned into a tracking phase and an interrupt phase, the instants at which the tracking phases in the first and second control signals end evidencing a fixed phase shift which is unequal to zero and less than half a control signal period.

* * * * *